United States Patent
Chen et al.

(10) Patent No.: US 6,693,306 B2
(45) Date of Patent: Feb. 17, 2004

(54) STRUCTURE OF A LIGHT EMITTING DIODE AND METHOD OF MAKING THE SAME

(75) Inventors: Tzer-Perng Chen, Hsinchu (TW); Rong-Yih Hwang, Hsinchu (TW); Charng-Shyang Jong, Hsinchu (TW); Cheng-Chung Young, Changhua (TW)

(73) Assignee: United Epitaxy Company, Ltd. (TW)

( * ) Notice: Subject to any disclaimer, the term of this patent is extended or adjusted under 35 U.S.C. 154(b) by 0 days.

(21) Appl. No.: 10/200,695

(22) Filed: Jul. 22, 2002

(65) Prior Publication Data

US 2004/0012030 A1 Jan. 22, 2004

(51) Int. Cl.$^7$ ............................................. H01L 29/22
(52) U.S. Cl. ........................... 257/99; 257/88; 257/91; 257/96; 438/28; 438/29; 438/34
(58) Field of Search .............................. 257/99, 88, 91, 257/95, 96, 97, 98; 438/28, 29, 34, 38, 39, 42, 43

(56) References Cited

U.S. PATENT DOCUMENTS 6,518,598 B1 * 2/2003 Chen ........................... 257/91

* cited by examiner

Primary Examiner—Sara Crane
(74) Attorney, Agent, or Firm—Webb Ziesenheim Logsdon Orkin & Hanson, P.C.

(57) ABSTRACT

A structure of a light emitting diode (LED) and a method of making the same are disclosed. The present invention is suitable for the light emitting diode having the area that is larger than 100 mil$^2$ and having the insulating substrate, and is featured in that the P electrode and the N electrode are mutually intercrossed. With the use of the present invention, the light emitted by each individual unit chip is more even; the operating voltage of the device is reduced; the cut size of the device can be enlarged arbitrarily according to the size of the unit chip; and the light emitting efficiency is increased.

18 Claims, 3 Drawing Sheets

STRUCTURE OF A LIGHT EMITTING DIODE AND METHOD OF MAKING THE SAME

FIELD OF THE INVENTION

The present invention relates to a structure of a light emitting diode (LED) and a method of making the same, and more particularly, to a structure of a light emitting diode with the P electrode and the N electrode mutually intercrossed, and a method of making the same.

BACKGROUND OF THE INVENTION

In recent years, a great deal of attention has been directed to the light-emitting device utilizing gallium nitride-based semiconductors such as GaN, AlGaN, InGaN, and AlInGaN. Usually, most of the light-emitting devices of the aforementioned type are grown on an electrically insulating sapphire substrate, which is different from other light-emitting devices utilizing a conductive substrate. Since the sapphire substrate is an insulator, the electrodes cannot be directly formed on the substrate directly, and has to directly contact the P-type semiconductor layer and the N-type semiconductor layer individually so as to complete the manufacturing of the light-emitting device formed on the sapphire substrate.

Please refer to FIG. 1 and FIG. 2, wherein FIG. 1 is a diagram showing the top view of the conventional light emitting diode made from the gallium nitride-based semiconductor, and FIG. 2 is a diagram showing the cross-sectional view taken from the a–a' line in FIG. 1. Such as shown in FIG. 1 and FIG. 2, an N-type GaN layer 20, an active layer 40, a P-type GaN layer 60, and a transparent contact layer 80 are sequentially formed as a stacked structure on a sapphire substrate 10. The aforementioned active layer 40 is made of GaN, AlGaN, InGaN, or AlInGaN having a double hetero-junction structure or a quantum well structure. Thereafter, an etching process is performed to expose a portion of the N-type GaN layer 20. Then the N electrode 70 and the P electrode 90 are formed respectively on the exposed surface of the N-type GaN layer 20 and on the surface of the transparent contact layer 80.

The aforementioned FIG. 1 and FIG. 2 show the conventional light emitting diode made from the gallium nitride-based semiconductor with small chip size. Generally, the actual size of such light emitting diode with small chip size is 10 mil×10 mil, or 8 mil×8 mil. When the size of the light emitting diode is larger than 10 mil×10 mil, such as 20 mil×20 mil (i.e. the area is 400 mil²), such light emitting diode belongs to the category of big chip size.

The sizes of P electrode and N electrode of the conventional light emitting diode with big chip size are not enlarged in accordance with the chip size. The reason resides in that the P electrode and the N electrode have the nature of blocking light. Hence, if the size of P electrode and that of the N electrode are enlarged as the size of the chip is enlarged, the light emitting efficiency of the light emitting diode with big chip size will be reduced. Therefore the conventional light emitting diode with big chip size utilizes another method for designing the P electrode and the N electrode. Please refer to FIG. 3, wherein FIG. 3 shows the top view of the conventional light emitting diode with big chip size. Since FIG. 3 merely shows the top view, only part of the elements of the conventional light emitting diode with big chip size can be illustrated in FIG. 3. Those elements shown in FIG. 3 are an N-type GaN layer 120, an N electrode 170, a transparent contact layer 180, and P electrode 190 wherein the N electrode 170 is located on a portion of the N-type GaN layer 120; the transparent contact layer 180 is located on another portion of the N-type GaN layer 120; and the P electrode 190 is located on the transparent contact layer 180. Moreover, in FIG. 3, an N pad 175 and a P pad 195 are further used as contacts for use in the connection of external wiring.

According FIG. 3, the conventional light emitting diode with big chip size is featured in a plurality of striped N electrodes 170 and P electrodes 190, and any two stripes of N electrodes 170 and P electrodes 190 are not mutually intercrossed. Besides this method can prevent the serious light blocking caused by the too large total electrode area, it can promote the evenness of current distribution. However, although this design has its own merits, yet its size is fixed, so that it lacks of the possibility for change in accordance with the actual demands.

SUMMARY OF THE INVENTION

Just as described above, the design of the conventional light emitting diode with big chip size still has room for improvement. Hence, an objective of the present invention is to provide a structure of a light emitting diode and a method of making the same, wherein the structure design is based on a unit chip, whereby the light emitted by each unit chip is more even and the operating voltage of the device is reduced.

Another objective of the present invention is to provide a structure of a light emitting diode and a method of making the same wherein all the P electrodes and the N electrodes on the wafer are respectively connected in series, whereby the cut size of the device can be enlarged arbitrarily according to the size of the unit chip.

Still another objective of the present invention is to provide a structure of a light emitting diode and a method of making the same, whereby the light emitting efficiency is increased.

According to the aforementioned objectives of the present invention, the present invention provides a structure of a light emitting diode comprising: a substrate; a semiconductor epitaxial structure comprising an N-type semiconductor layer, an active layer, and a P-type semiconductor layer, wherein the N-type semiconductor layer covers the substrate, and a plurality of extrusions are formed on a portion of a surface of the N-type semiconductor layer, and a channel is formed between every two adjacent extrusions, and the active layer and the P-type semiconductor layer are stacked in sequence on the extrusions; an N-type electrode layer which adheres to the N-type semiconductor layer and is located in the channel; and a plurality of P-type electrodes located above the P-type semiconductor layer. Moreover, the structure of the light emitting diode according to the present invention further comprises a transparent contact layer located between the P-type semiconductor layer and the P-type electrodes. Furthermore, the structure of the light emitting diode according to the present invention further comprises an insulating layer covering the transparent contact layer and the N-type electrodes, wherein a portion of the N-type electrode layer is exposed to be an N-type pad; and a conductive layer that covers the insulating layer and is connected to the P-type electrodes, wherein at least one P-type electrode of the P-type electrodes is a P-type pad.

Furthermore, according to the aforementioned objectives of the present invention, the present invention provides a method of making the above structure of a light emitting diode. The method comprises the following steps: firstly, providing a substrate; then, forming an N-type semiconductor layer covering the substrate, wherein a plurality of extrusions are formed on a portion of a surface of the N-type semiconductor layer and a channel is formed between every two adjacent extrusions; then, forming an active layer covering the extrusions; then, forming a P-type semiconductor layer covering the active layer; then, forming a transparent contact layer covering the P-type semiconductor layer; then, forming an N-type electrode layer which adheres to the N-type semiconductor layer and is located in the channel; then, forming a plurality of P-type electrodes adhering to a portion of a surface of the transparent contact layer; then, forming an insulating layer covering the transparent contact layer and the N-type electrodes, wherein a portion of the N-type electrode layer is exposed to be an N-type pad; and then forming a conductive layer which covers the insulating layer and is connected to the P-type electrodes, wherein at least one P-type electrode of the P-type electrodes is a P-type pad.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
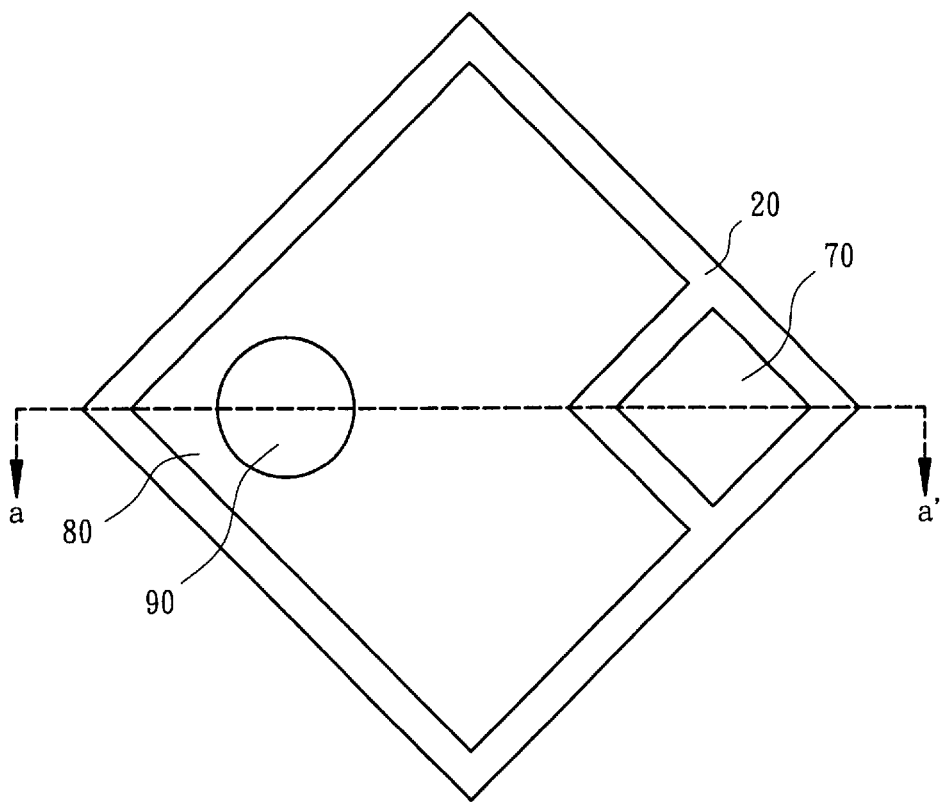
FIG. 1 is a diagram showing the top view of the conventional light emitting diode made from the gallium nitride-based semiconductor.
Figure 2:
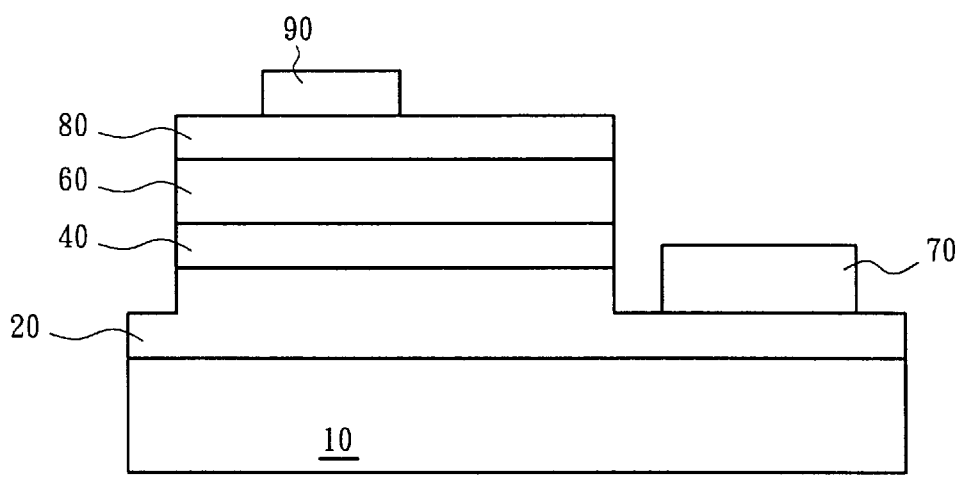
FIG. 2 is a diagram showing the cross section viewed along the a–a' line in FIG. 1.
Figure 3:
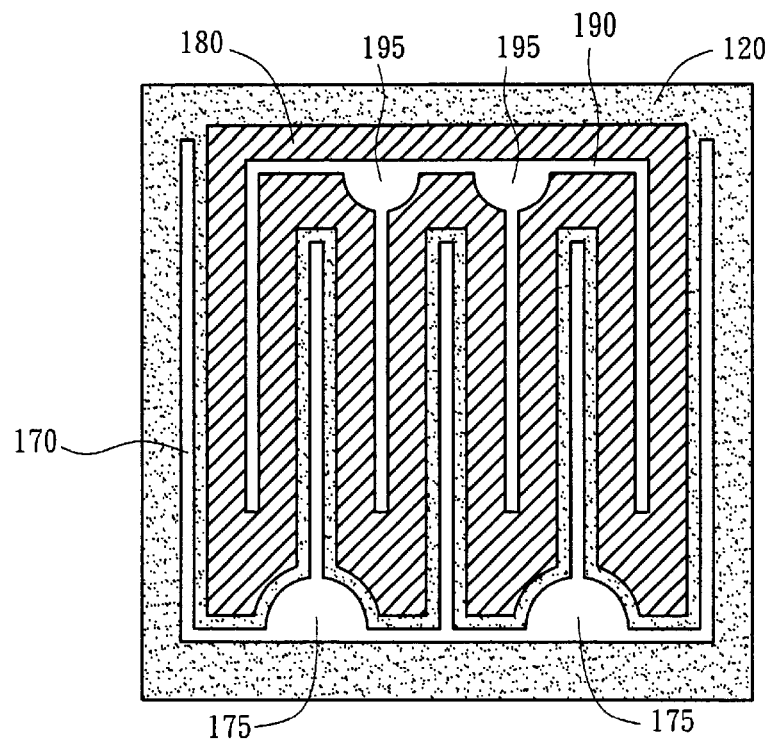
FIG. 3 is a diagram showing the top view of the conventional light emitting diode with big chip size.
Figure 4:
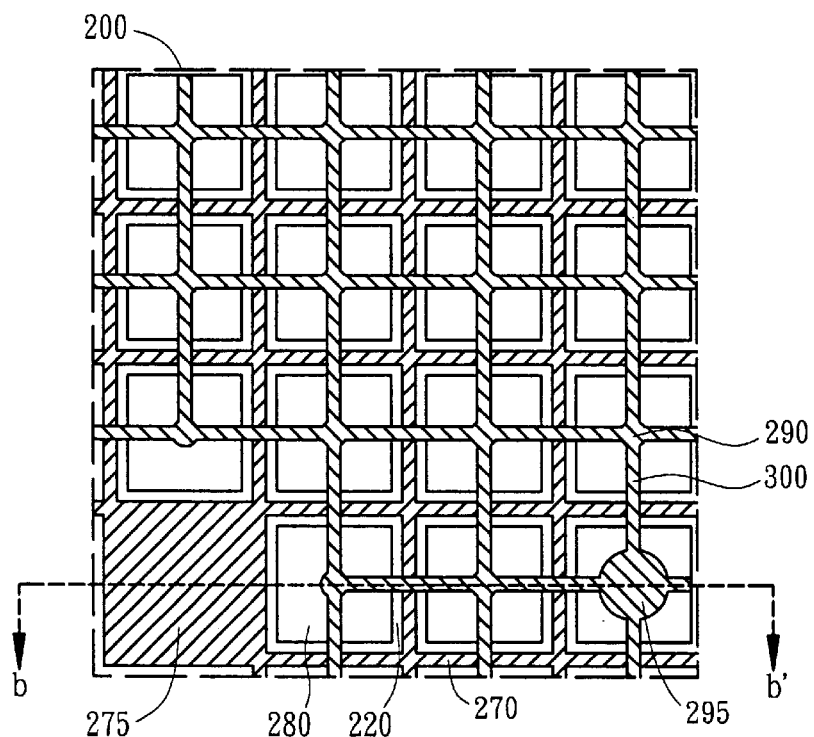
FIG. 4 is a diagram showing the top view of the light emitting diode with big chip size according to an embodiment of this invention.

The structure of light emitting diode and the method of making the same of this invention are suitable for the light emitting diode having the area that is larger than 100 mil$^2$, the light emitting diode also having the insulating substrate, and the present invention is featured in that the P electrode and the N electrode are mutually intercrossed. Please refer to FIG. 4 showing the top view of the light emitting diode with big chip size according to an embodiment of this invention. The single one light emitting diode with big chip size according to this invention is the unit chip 200 in FIG. 4. The size of the unit chip 200 is about 40 mil×40 mil. That is, the length of the unit chip 200 is 4 times as much as the length 10 mil of the conventional light emitting diode, and the area of the unit chip 200 is 16 times as much as the area 100 mil$^2$ of the conventional light emitting diode. However, this invention is not limited thereto. In fact, this invention is suitable for the condition that the area of the unit chip 200 is larger than 100 mil$^2$, wherein formerly a plurality of P electrodes and N electrodes had to be added if the conventional method as shown in FIG. 3 were adopted. Hence, the size of the unit chip 200 is not necessarily 40 mil×40 mil. For example, the size of the unit chip 200 may be 10 mil×20 mil, 10 mil×40 mil, 20 mil×20 mil, and so on.

Since FIG. 4 is the top view, only part of the elements of the unit chip 200 can be illustrated in FIG. 4. Those elements shown in FIG. 4 are an N-type semiconductor layer 220, an N-type electrode layer 270, a transparent contact layer 280, a plurality of P-type electrodes 290, and a conductive layer 300. Moreover, an insulating layer is omitted in FIG. 4 to clearly show the elements hidden under the insulating layer, such as the N-type semiconductor layer 220, the N-type electrode layer 270, and the transparent contact layer 280. Concerning the positional relationship between the insulating layer and other elements, please refer to FIG. 5 that will be described in details later.

Concerning FIG. 4, the N-type electrode layer 270 is located on a portion of the N-type semiconductor layer 220, and the transparent contact layer 280 is located on another portion of the N-type semiconductor layer 220, and a plurality of P-type electrodes 290 are located on the transparent contact layer 280. Moreover, the conductive layer 300 is used to connect the P-type electrodes 290 that are originally separated. Furthermore, in FIG. 4, an N-type pad 275 and a P-type pad 295 are respectively connected to the N-type electrodes 270 and the conductive layer 300, whereby the N-type pad 275 and the P-type pad 295 can be used as contacts to which the external wirings are connected.

Figure 5:
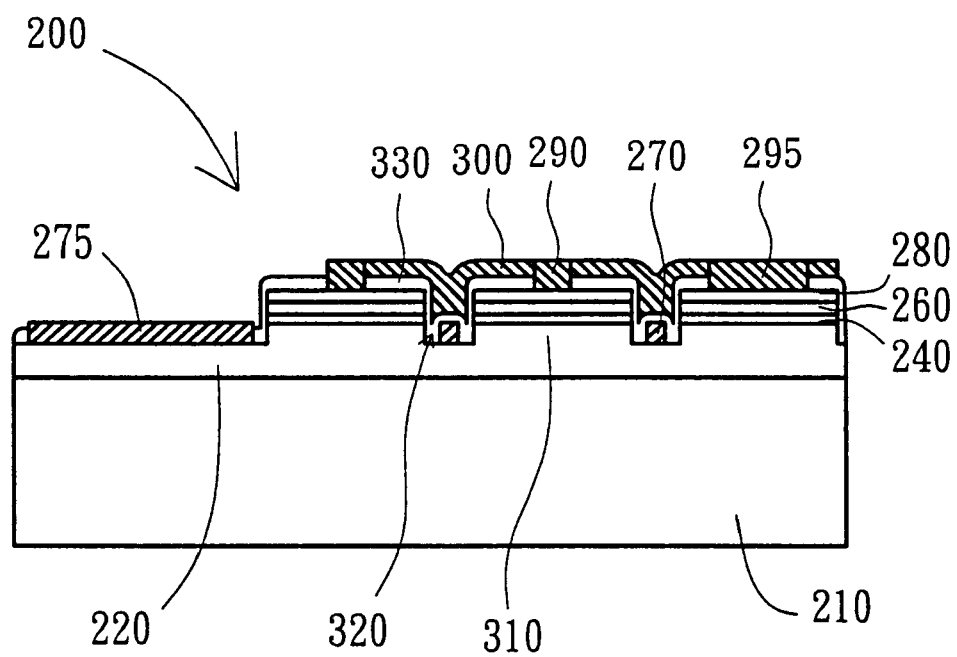
FIG. 5 is a diagram showing the cross section viewed along the b–b' line in FIG.

Please refer to FIG. 5 showing the cross section viewed along the b–b' line in FIG. 4 to understand more clearly the connection relationship between the elements of the unit chip 200. The unit chip 200 in FIG.5 comprises: a substrate 210, the N-type semiconductor layer 220, an active layer 240, a P-type semiconductor layer 260, the N-type electrode layer 270, the N-type pad 275, the transparent contact layer 280, the P-type electrodes 290, the P-type pad 295, an insulating layer 330, and the conductive layer 300. It can be seen in FIG. 5 that the N-type semiconductor layer 220 covers the substrate 210, wherein a plurality of extrusions 310 are formed on a portion of the surface of the N-type semiconductor layer 220, and the shape of the extrusions is such as a rectangular prism. Moreover, a channel 320 is formed between the extrusions 310. Furthermore, the aforementioned substrate 210 is made of the insulating material, such as sapphire or glass, and the material of the N-type semiconductor layer 220 is: such as GaN, AlGaN, InGaN, or AlInGaN.

In addition, the active layer 240, the P-type semiconductor layer 260, and the transparent contact layer 280 are stacked in sequence from the bottom to the top on the aforementioned extrusions 310. Besides, the active layer 240 is made of the material such as GaN, AlGaN, InGaN, or AlInGaN with a double hetero-junction structure or a quantum well structure. Moreover, the P semiconductor layer 260 is also made of the material such as GaN, AlGaN, InGaN, or AlInGaN, and the transparent contact layer 280 is made of the transparent and conductive material to satisfy the demands of being permissible to light and being conductive electrically.

Furthermore, the N-type electrode layer 270 adheres on a portion of the N-type semiconductor layer 220 in the channel 320, and the P-type electrodes 290 adheres on a portion of the surface of the transparent contact layer 280. Besides, the insulating layer 330 covers the exposed bottom of the channel 320, the exposed transparent contact layer 280, and the exposed N-type electrode layer 270, but a portion of the N-type electrode layer 270 is still exposed to be an N-type pad 275 as a contact of the unit chip 200 for use in the connection of external wirings. In addition, the conductive layer 300 covers the insulating layer 330 and is connected to the P-type electrodes 290, wherein at least one P-type electrode 290 is used to be a P-type pad 295 as another contact of the unit chip 200 for use in the connection of external wirings.

In addition to the aforementioned structure of the light emitting diode, the present invention further provides a method of making the light emitting diode, the method comprising the following steps. Firstly, the substrate 210 is provided. Next, the N-type semiconductor layer 220 is formed to cover the substrate 210, wherein the extrusions 220 are formed on a portion of a surface of the N-type semiconductor layer 220, and the channel 320 is formed between the extrusions 310.

Then, the active layer 240, the P-type semiconductor layer 260, and the transparent contact layer 280 are stacked sequentially form the bottom to the top on the aforementioned extrusions 310. Next, the N-type electrode layer 270 is formed to adhere to a portion of the N-type semiconductor layer 220 in the channel 320. Then, the P-type electrodes 290 are formed to adhere to a portion of the transparent contact layer 280. Then, the insulating layer 330 are formed to cover the exposed bottom of the channel 320, the transparent contact layer 280, and the N-type electrode layer 270 portion of which is still exposed. This exposed portion of the N-type electrode layer 270 is the N-type pad 275 used as a contact of the unit chip 200 for use in the connection of external wirings. Next, the conductive layer 300 is formed to cover the insulating layer 330 and connected to the P-type electrodes 290, wherein at least one of the P-type electrodes is used to be the P-type pad 295 as another contact of the unit chip 200 for use in the connection of external wirings.

To sum up, the structure of the light emitting diode is featured in that the N-type electrode layer 270 and the conductive layer 300 connected to the P-type electrodes 290 are mutually intercrossed, according to the top view of FIG. 4. However, as a matter of fact, the N-type electrode layer 270 is located under the P-type electrodes 290 and the conductive layer 300, wherein the insulating layer 330 (FIG. 5) is used therebetween to separate the N-type electrode layer 270 and the conductive layer 300 so as to avoid mutual contacts causing short-circuiting. Moreover, one advantage of the present invention is to provide a structure of a light emitting diode and a method of making the same, wherein the structure is designed for a unit chip, whereby the light emitted by each unit chip is more even, and the operating voltage of the device is reduced.

Another advantage of the present invention is to provide a structure of a light emitting diode and a method of making the same. With the use of the present invention, all the P electrodes and the N electrodes on the wafer are connected in series respectively, whereby the cut size of the device can be enlarged arbitrarily according to the size of the unit chip.

Still another advantage of the present invention is to provide a structure of a light emitting diode and a method of making the same, whereby the light emitting efficiency is increased. Herein the light emitting efficiency stands for the luminance of the light emitting diode per unit of electrical power dissipated. Due to the present invention having the channel 320 (FIG. 5) in the light emitting diode with big chip size, the counts of the total reflection of light are reduced, so that and the light can be emitted from the channel 320 earlier, thereby increasing the light emitting efficiency of the light emitting diode.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A structure of a light emitting diode (LED), comprising:
   a substrate;
   a semiconductor epitaxial structure, comprising an N-type semiconductor layer, an active layer, P-type semiconductor layer and a transparent contact layer, wherein the N-type semiconductor layer covers the substrate, and a plurality of extrusions are formed on a portion of a surface of the N-type semiconductor layer, and a channel is formed between the every two adjacent extrusions of the plurality of extrusions, and the active layer, the P-type semiconductor layer and the transparent contact layer are sequentially stacked on the plurality of extrusions;
   an N-type electrode layer which adheres to the N-type semiconductor layer and is located in the channel;
   a plurality of P-type electrodes located above the transparent contact layer;
   an insulating layer covering the transparent contact layer and the N-type electrode layer, wherein a portion of the N-type electrode layer is exposed to be an N-type pad; and
   a conductive layer which covers the insulating layer and is connected to the plurality of P-type electrodes, wherein at least one P-type electrode of the plurality of P-type electrodes is a P-type pad.

2. The structure of the light emitting diode according to claim 1, wherein the material of the substrate is selected from a group consisting of sapphire and glass.

3. The structure of the light emitting diode according to claim 1, wherein the shape of the extrusions is rectangular prism.

4. The structure of the light emitting diode according to claim 1, wherein the material of the N-type semiconductor layer, that of the P-type semiconductor layer, and that of the active layer are selected from a group consisting of GaN, AlGaN, InGaN, and AlInGaN.

5. The structure of the light emitting diode according to claim 4, wherein. the active layer has a double heterojunction structure.

6. The structure of the light emitting diode according to claim 4, wherein the active layer has a quantum well structure.

7. A structure of a light emitting diode, comprising:
   a substrate;
   an N-type semiconductor layer covering the substrate, wherein a plurality of extrusions are formed on a portion of a surface of the N-type semiconductor layer, and a channel is formed between every two adjacent extrusions of the plurality of extrusions;
   an active layer covering the extrusions;
   a P-type semiconductor layer covering the active layer;
   a transparent contact layer covering the P-type semiconductor layer;
   an N-type electrode layer which adheres to the N-type semiconductor layer and is located in the channel;
   a plurality of P-type electrodes which adheres to a portion of a surface of the transparent contact layer;
   an insulating layer covering the transparent contact layer and the N-type electrode layer, wherein a portion of the N-type electrode layer is exposed to be an N-type pad; and
   a conductive layer which covers the insulating layer and is connected to the plurality of P-type electrodes, wherein at least one P-type electrode of the P-type electrodes is a P-type pad.

8. The structure of the light emitting diode according to claim 7, wherein the material of the substrate is sapphire.

9. The structure of the light emitting diode according to claim 7, wherein the material of the substrate is glass.

10. The structure of the light emitting diode according to claim 7, wherein the shape of the extrusions is rectangular prism.

11. The structure of the light emitting diode according to claim 7, wherein the material of the N-type semiconductor layer, that of the P-type semiconductor layer, and that of the active layer are selected from a group consisting of GaN, AlGaN, InGaN, and AlInGaN.

12. The structure of the light emitting diode according to claim 11, wherein the active layer has a double heterojunction structure.

13. The structure of the light emitting diode according to claim 11, wherein the active layer has a quantum well structure.

14. A method of making a light emitting diode, comprising:

providing a substrate;

forming an N-type semiconductor layer covering the substrate, wherein a plurality of extrusions are formed on a portion of a surface of the N-type semiconductor layer, and a channel is formed between every two adjacent extrusions of the plurality of extrusions;

forming an active layer covering the plurality of the extrusions;

forming a P-type semiconductor layer covering the active layer;

forming a transparent contact layer covering the P-type semiconductor layer;

forming an N-type electrode layer which adheres to the N-type semiconductor layer and is located in the channel;

forming a plurality of P-type electrodes adhering to a portion of a surface of the transparent contact layer;

forming an insulating layer covering the transparent contact layer and the N-type electrode layer, wherein a portion of the N-type electrode layer is exposed to be an N-type pad; and forming a conductive layer which covers the insulating layer and is connected to the P-type electrodes, wherein at least one P-type electrode of the P-type electrodes is a P-type pad.

15. The method of making the light emitting diode according to claim 14, wherein the material of the substrate is selected from a group consisting of sapphire and glass.

16. The method of making the light emitting diode according to claim 14, wherein the shape of the extrusions is rectangular prism.

17. The method of making the light emitting diode according to claim 14, wherein the material of the N-type semiconductor layer, that of the P-type semiconductor layer, and that of the active layer are selected from a group consisting of GaN, AlGaN, InGaN, and AlInGaN.

18. The method of making the light emitting diode according to claim 17, wherein the structure of the active layer is selected from a group consisting of double heterojunction structure and quantum well structure.

* * * * *